(12) United States Patent
Nickel et al.

(10) Patent No.: US 6,930,369 B2
(45) Date of Patent: Aug. 16, 2005

(54) THIN FILM DEVICE AND A METHOD OF PROVIDING THERMAL ASSISTANCE THEREIN

(75) Inventors: Janice H. Nickel, Sunnyvale, CA (US); Manoj Bhattacharyya, Cupertino, CA (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/713,510

(22) Filed: Nov. 14, 2003

(65) Prior Publication Data

US 2005/0104146 A1    May 19, 2005

(51) Int. Cl.⁷ .......................... H01L 29/82; H01L 43/00
(52) U.S. Cl. .............................. 257/421; 257/E27.006; 257/295
(58) Field of Search ........................ 257/421, E27.006, 257/295

(56) References Cited

U.S. PATENT DOCUMENTS

| | | | |
|---|---|---|---|
| 6,130,835 A | 10/2000 | Scheuerlein | |
| 6,233,206 B1 * | 5/2001 | Hamann et al. | 369/13.01 |
| 6,339,544 B1 * | 1/2002 | Chiang et al. | 365/163 |
| 6,385,082 B1 * | 5/2002 | Abraham et al. | 365/171 |
| 6,702,186 B1 * | 3/2004 | Hamann et al. | 235/493 |
| 6,704,220 B2 * | 3/2004 | Leuschner | 365/173 |
| 6,724,674 B2 * | 4/2004 | Abraham et al. | 365/211 |
| 6,764,897 B2 * | 7/2004 | Lowrey et al. | 438/238 |

* cited by examiner

Primary Examiner—David Nelms
Assistant Examiner—Tu-Tu Ho

(57) ABSTRACT

A thin film device and a method of providing thermal assistance therein is disclosed. Accordingly, a heater material is utilized to thermally assist in the operation of the thin film device. By utilizing a heater material to thermally assist in the operation of the thin film device, a substantial improvement in the accuracy and performance of the thin film device is achieved. A first aspect of the present invention is a thin film device. The thin film device includes at least one patterned thin film layer, a heater material coupled to the at least one patterned thin film layer for providing thermal assistance to the at least one of the patterned thin film layers and a conductor coupled to the heater material for supplying energy to the heater material.

22 Claims, 5 Drawing Sheets

THIN FILM DEVICE AND A METHOD OF PROVIDING THERMAL ASSISTANCE THEREIN

FIELD OF THE INVENTION

The present invention relates generally to thin film devices and more particularly to a thin film device and a method of providing thermal assistance therein.

BACKGROUND OF THE INVENTION

Thin film devices comprising device layers deposited on CMOS substrates are well-known. Such a thin film device is manufactured by stacking a plurality of device layers in order on a substrate. Such devices include memory elements, sensors, emitters, etc.

Consider the example of an MRAM thin film device including a resistive cross point array of spin dependent tunneling (SDT) junctions, word lines extending along rows of the SDT junctions, and bit lines extending along columns of the SDT junctions. Each SDT junction is located at a cross point of a word line and a bit line. The magnetization of each SDT junction assumes one of two stable orientations at any given time. These two stable orientations, parallel and anti-parallel, represent logic values of '0' and '1'. The magnetization orientation, in turn, affects the resistance of the SDT junction. Resistance of the SDT junction is a first value (R) if the magnetization orientation is parallel and a second value (R+$\Delta$R) if the magnetization orientation is anti-parallel. The magnetization orientation of the SDT junction and, therefore, its logic value may be read by sensing its resistance state.

A write operation on a selected SDT junction is performed by supplying write currents to the word and bit lines crossing the selected SDT junction. The currents create two external magnetic fields that, when combined, switch the magnetization orientation of the selected SDT junction from parallel to anti-parallel or vice versa.

Too small a write current might not cause the selected SDT junction to change its magnetization orientation. Conventional MRAM designs sometimes need one or two current driven magnetic fields to switch the magnetization orientation. However, the magnitude of the current(s) needed to switch the magnetization orientation is too high to maintain the cost advantage of the implementation of the MRAM device. Furthermore, as technology develops, this problem will be exacerbated.

Accordingly, what is needed is a thin film device and a method of implementation thereof that addresses the above described problem related to MRAM devices. The present invention addresses this need.

SUMMARY OF THE INVENTION

A thin film device and a method of providing thermal assistance therein is disclosed. Accordingly, a heater material is utilized to thermally assist in the operation of the thin film device. By utilizing a heater material to thermally assist in the operation of the thin film device, a substantial improvement in the accuracy and performance of the thin film device is achieved.

A first aspect of the present invention is a thin film device. The thin film device includes at least one patterned thin film layer, a heater material coupled to the at least one patterned thin film layer for providing thermal assistance to the at least one patterned thin film layer and a conductor coupled to the heater material for supplying energy to the heater material.

A second aspect of the present invention is a method of providing thermal assistance in a thin film device. The method includes heating at least one of a plurality of patterned thin film layers by selectively exposing the at least one of the plurality of patterned thin film layers to energy from a power source and performing an operation with the selectively exposed at least one of the plurality of patterned thin films.

Other aspects and advantages of the present invention will become apparent from the following detailed description, taken in conjunction with the accompanying drawings, illustrating by way of example the principles of the invention.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION

Figure 1:
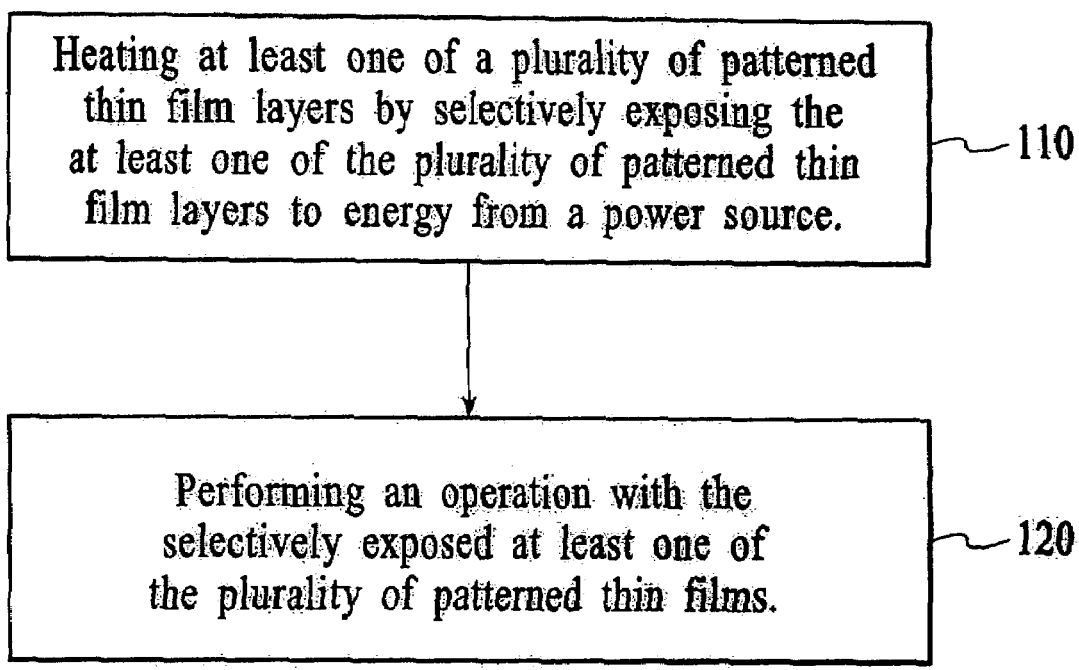
FIG. 1 is a high-level flow chart of a method in accordance with an embodiment of the present invention.

The present invention relates to a thin film device and a method providing thermal assistance therein. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

As shown in the drawings for purposes of illustration, a thin film device and a method of providing thermal assistance therein is disclosed. Accordingly, a heater material is utilized to thermally assist in the operation of the thin film device. By utilizing a heater material to thermally assist in the operation of the thin film device, a substantial improvement in the accuracy and performance of the thin film device is achieved.

FIG. 1 is a high level flow chart of a method providing thermal assistance in a thin film device. A first step 110 includes heating at least one of a plurality of patterned thin film layers by selectively exposing the at least one of the plurality of patterned thin film layers to energy from a power source. A second step 120 includes performing an operation with the selectively exposed at least one of the plurality of patterned thin films.

The method of providing thermal assistance to a thin film device is a generic method and has applications in many areas. Consider the example of the MRAM thin film device. As shown in the drawings for purposes of illustration, the MRAM device includes a plurality of magnetic memory elements. A magnetic memory element of the MRAM device could be any element having a resistance that is dependent upon the state of its magnetic film. Examples of such elements include magnetic tunnel junctions (the spin dependent tunnel (SDT) junction is a type of magnetic tunnel junction) and giant magnetoresistance ("GMR") spin valves. For the purposes of illustration, the memory elements will be described below as SDT junctions.

Figure 2:
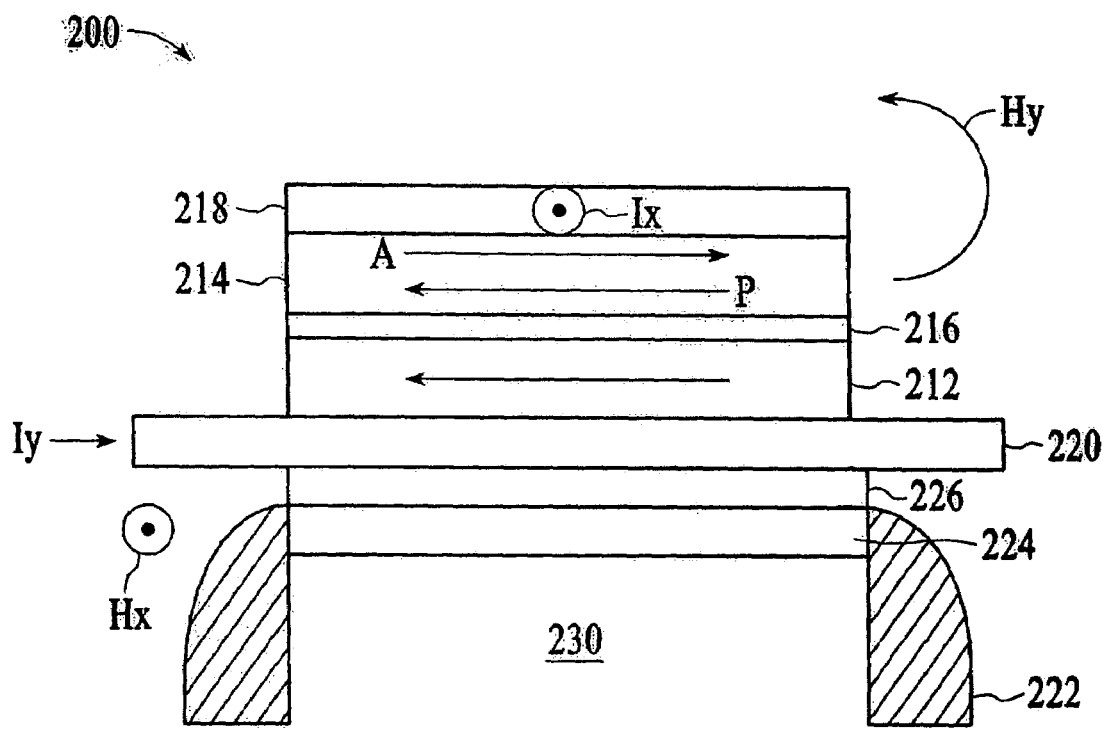
FIG. 2 shows an SDT junction in accordance with an embodiment of the present invention.

FIG. 2 shows an SDT junction 200. The SDT junction 200 includes a patterned group of thin film layers. This group includes a pinned layer 212 having a magnetization that is oriented in the plane of the pinned layer 212 but fixed by an anti-ferromagnetic pinning layer (not shown) so as not to rotate in the presence of an applied magnetic field in a range of interest. In an alternate embodiment, the pinned layer 212 is a synthetic ferromagnet pinned by an anti-ferromagnetic pinning layer.

The SDT junction 200 also includes a "free" layer 214 having a magnetization orientation that is not pinned. Rather, the magnetization can be oriented in either of two directions along an axis (the "easy" axis) lying in the plane of the free layer 214. Other layers such as seed layers, anti-ferromagnetic pinning layers and synthetic ferromagnetic layers, etc., may also be included in a SDT junction. If the magnetization of the pinned and free layers 212 and 214 are in the same direction, the orientation is said to be "parallel" (as indicated by the arrow P). If the magnetization of the pinned and free layers 212 and 214 are in opposite directions, the orientation is said to be "anti-parallel" (as indicated by the arrow A). It should also be pointed out that the free layer 214 is sometimes referred to as the data layer or the sense layer.

The pinned layer 212 and the free layer 214 are separated by an insulating tunnel barrier 216. Although the free layer 214 is shown in FIG. 2 as being above the tunneling barrier 216, the free layer 214 may be either above or below the tunnel barrier 216. The insulating tunnel barrier 216 allows quantum mechanical tunneling to occur between the pinned layer 212 and the free layer 214. This tunneling phenomenon is electron spin dependent, making the resistance of the SDT junction 200 a function of the relative orientations of the magnetization of the pinned layer 212 and the free layer 214. For instance, resistance of the SDT junction 200 is a function of the relative orientations of the magnetization of the pinned layer 212 and the free layer 214. For instance, resistance of the SDT junction 200 is a first value (R) if the magnetization orientation of the pinned layer 212 and the free layer 214 is parallel and a second value (R+ΔR) if the magnetization orientation is anti-parallel.

In an embodiment, the SDT junction 200 is deposited on a dielectric material 230 such as $SiO_2$, $Si_3N_4$, AlN, $Al_2O_3$, etc. The SDT junction 200 includes a sidewall material 222 and a heater material 224 whereby the heater material 224 is located in between a sidewall material 222. The sidewall material 222 is a highly conductive material capable of absorbing energy from a power source. In an embodiment, the sidewall material 222 is a material such as Cu, Au, Ag, Pt or any combination thereof. Furthermore, the sidewall material 222 can be referred to as a "split" conductor since the sidewall material 222 is split and covers opposite sides of the dielectric material 230. Also shown in FIG. 2 is an optional dielectric layer 226 in contact with a sense line 220. Otherwise, the heater material 224 is in direct contact with the sense line 220.

Magnetic fields ($H_x$, $H_y$) may be applied to the SDT junction 200 by supplying current ($I_x$) through the split conductor 222 and current ($I_y$) to the conductor 218. If the conductors 218 and 222 are orthogonal, the applied magnetic fields (Hx, Hy) will also be orthogonal.

When sufficiently large currents ($I_x$, $I_y$) are passed through the conductors 218 and 222 (e.g. during a write operation), the combined magnetic field ($H_x$, $H_y$) in the vicinity of the free layer 214 causes the magnetization of the free layer 214 to rotate from the parallel orientation to the anti-parallel orientation, or vice-versa. For example, a sufficient current $+I_x$ will cause the magnetization to be anti-parallel whereas a sufficient current $-I_y$ will cause the magnetization orientation to be parallel.

Figure 3:
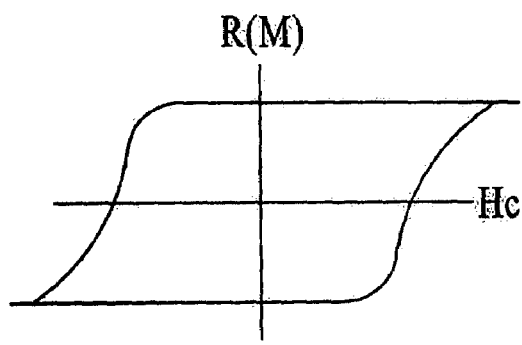
FIG. 3 shows the coercivity ($H_c$) of the SDT junction at room temperature.
Figure 4:
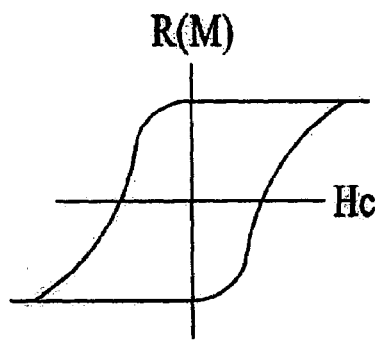
FIG. 4 shows the coercivity ($H_c$) of the SDT junction at 50° C. above room temperature.

Current magnitudes may be selected so that the combined magnetic field ($H_x+H_y$) exceeds the switching field of the free layer 214 but does not exceed the switching field of the pinned layer 212. However, the magnitude of one or both write currents ($I_x$, $I_y$) may be reduced if the SDT junction 200 is heated. Coercivity of a magnetic film decreases with increasing temperature. Raising the temperature of the SDT junction 200 reduces the coercivity ($H_c$) of the SDT junction 200 as shown in FIGS. 3 and 4. FIG. 3 shows the coercivity ($H_c$) at room temperature while FIG. 4 shows the coercivity ($H_c$) at a temperature ΔT above room temperature. At the elevated temperature, the SDT junction 200 switches from a high resistance state to a low resistance state and vice-versa in the presence of a lower combined magnetic field ($H_x+H_y$). Therefore, heating the SDT junction 200 allows the magnitudes of one or both of the write currents ($I_x$, $I_y$) to be reduced. If, on the other hand, the magnitudes of the write currents ($I_x$, $I_y$) are not reduced, the SDT junction 200 will switch more reliably in the presence of the combined magnetic field ($H_x+H_y$). The temperature and write current can be varied to achieve a desired switching reliability.

Heat may be applied and removed before the combined magnetic field ($H_x+H_y$) is applied, or the heat may be applied at the same time as the combined magnetic field ($H_x+H_y$). The free layer 214 may be heated to about 0° C. to 50° C. above room temperature. More generally, the maximum heating temperature may be about 50° C. less than the Blocking temperature TB (the temperature above which the pinning properties are lost). However, one of ordinary skill in the art will readily recognize that the free layer 214 can be heated to any temperature while remaining within the spirit and scope of the present invention.

Heat is applied to the free layer 214 by connecting a power source to the sidewall material 222. In an embodiment, the power source is a high frequency AC power source coupled to a decoder. The frequency can be a radio frequency or any other of a variety of frequencies that are empirically determined. As previously mentioned, a heater material 224 is located in between the sidewall material 222. In varying embodiments, the heater material 222 is amorphous carbon or amorphous silicon or a metallic material. Accordingly, prior to or simultaneous with the performance of a write operation (i.e. the application of a write current), the power source supplies energy to the sidewall material 222.

The energy from the power source is then transferred from the sidewall material 222 to the heater material 224. Accordingly, heat is transferred to the free layer 214 through the heater material 224, the dielectric material 226, the sense line 220, the pinned layer 212 and the tunnel barrier 216, if the free layer 214 is above the tunnel barrier 216. Alternatively, if the free layer 214 is below the tunnel barrier 216, the heat is transferred to the free layer 214 through the heater material 224, dielectric material 226, the sense line 220 and the pinned layer 212. In any case, once heated, the free layer 214 requires significantly lower write currents to switch the magnetization state.

Figure 5:
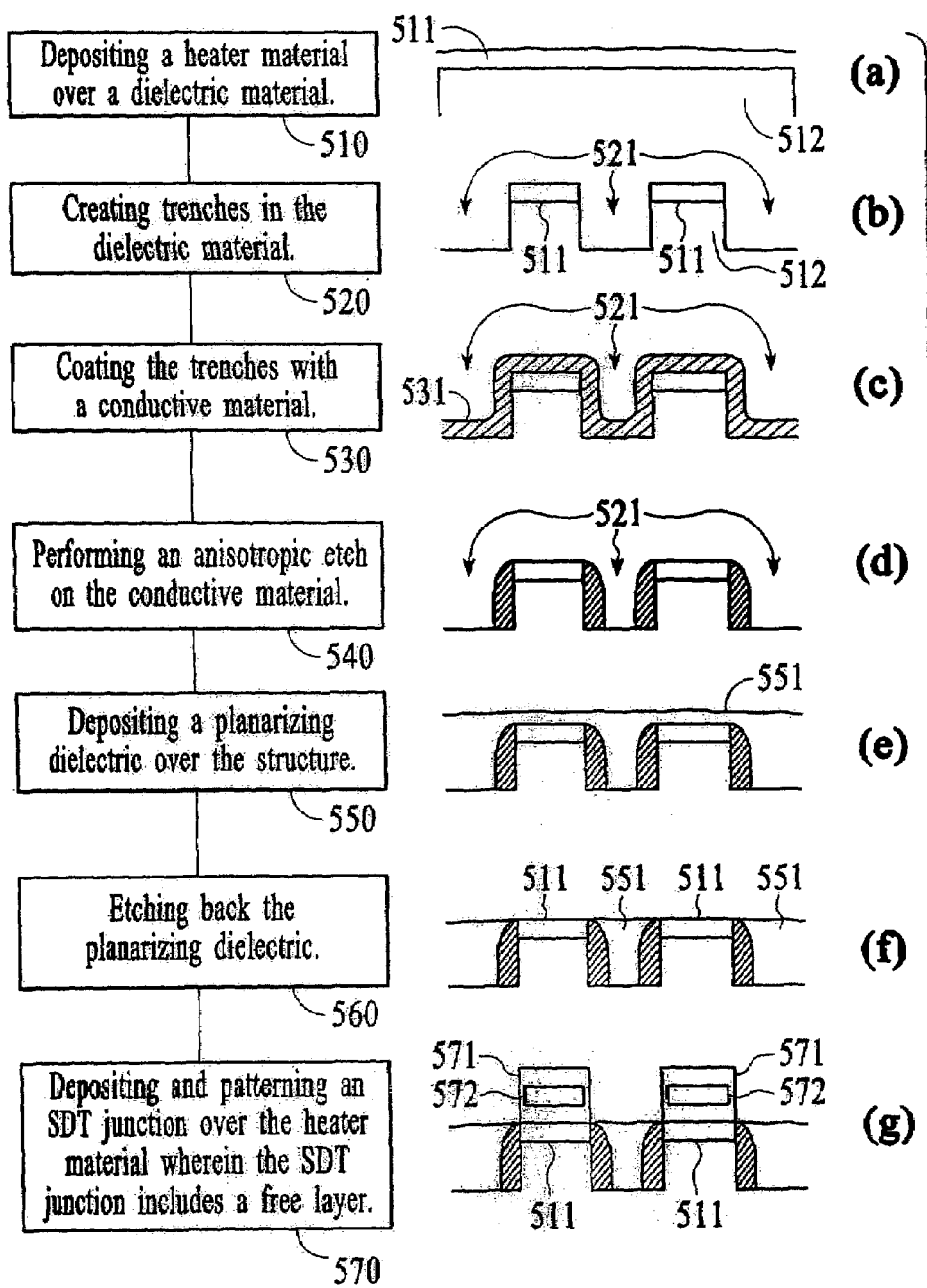
FIGS. 5(a–g) are cross sectional view showing the resulting structures of the flowchart in accordance with embodiments of the present invention.

Please refer now to FIG. 5. FIG. 5 is a flow chart illustrating the method steps for fabricating a magnetic random access memory array along with a series of cross sectional views (FIGS. 5(a–g)) showing the resulting structure.

A first step 510 includes depositing a heater material 511 over a dielectric material 512. The heater material 511 is metal, amorphous carbon, amorphous silicon or the like. A second step 520 includes creating trenches 521 in the dielectric material 512. As can be seen in FIG. 5(b), the heater material 511 remains in between the trenches 521. A third step 530 includes coating the trenches 521 with a conductive material 531. A highly conductive material such as Cu, Au, Ag, Pt or any combination thereof is used in this step.

The next step 540 includes performing an anisotropic etch on the conductive material 531. Since the etching process in step 540 is anisotropic, meaning that it removes material directionally, this step clears the conductive material 531 from the tops and bottoms of the trenches 521 thereby leaving the conductive material 531 as sidewalls in the trenches 521.

A next step 550 includes depositing a planarizing dielectric 551 over the structure. A next step 560 includes etching back the planarizing dielectric 551. Here, the planarizing dielectric 551 is etched back to expose the top of the heater material 511. This is accomplished with a chemical-mechanical polishing process or the like. The next step 570 includes depositing an SDT junction materials stack over the planarized dielectric and heater material 511 and patterning an SDT junction 572 wherein the patterned SDT junction 572 includes a free layer 572.

In an embodiment, the conductive sidewall material is coupled to a power source via a decoder whereby the power source is utilized to heat the SDT junction prior to or simultaneous with the application of a write current thereby reducing the amount of current required to switch the magnetization of the free layer.

Figure 6:
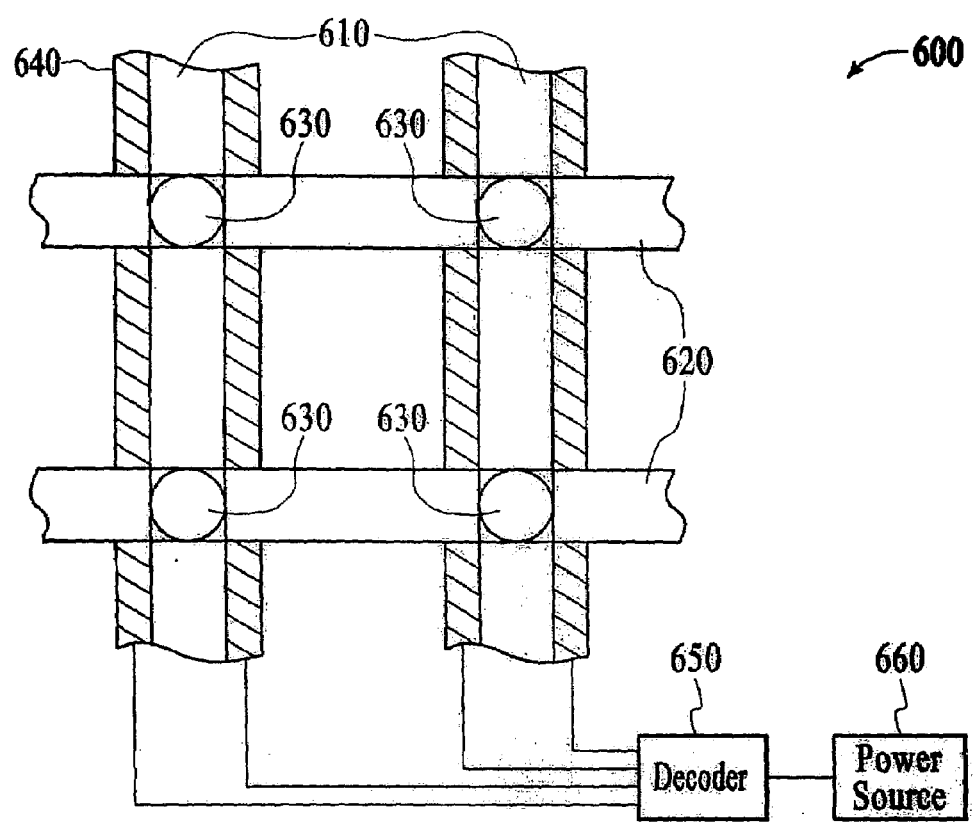
FIG. 6 is a top perspective view of a structure in accordance with an embodiment of the present invention.

For a better understanding, please refer now to FIG. 6. FIG. 6 is a top perspective view of a structure 600 in accordance with an embodiment. FIG. 6 shows top conductors 610, sense lines 620 and SDT junctions 630. The conductive sidewall material 640 is a material capable of absorbing energy from a power source and is coupled to the decoder 650 whereby the decoder 650 is coupled to the power source 660. In an embodiment the decoder 650 applies energy from the power source 660 to the conductive sidewall material 640 in a selective fashion. Stated another way, the decoder 650 selects the row and/or column to which to apply energy from the power source 660. The decoder 650 is coupled to the conductive sidewall material 640 via copper wire, aluminum wire or the like. In an embodiment, the power source applies radio frequency energy to the sidewall material 640.

Figure 7:
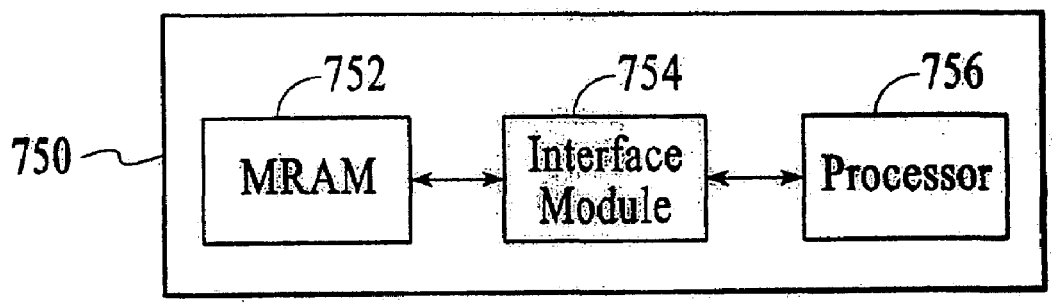
FIG. 7 is a computer system in accordance with an embodiment of the present invention.

The MRAM device described herein may be used in a variety of applications. FIG. 7 shows an exemplary general application for an MRAM device in accordance with an embodiment. The general application is embodied by a system 750 including an MRAM device 752 in accordance with an embodiment, an interface module 754 and a processor 756. Interface module 754 provides an interface between processor 756 and MRAM device 752. System 750 could also include other types and/or levels of memory.

For a system 750 such as a notebook computer or personal computer, the interface module 754 might include an IDE or SCSI interface. For a system 750 such as a server, multiple MRAM devices could be implemented and interface module 754 might include a fiber channel or SCSI interface. For a device 750 such as a digital camera, the interface module 754 might include a camera interface. Here, the MRAM device 753 would allow non-volatile storage of digital images on-board the digital camera.

The above embodiments of the MRAM device may offer advantages over other MRAM devices. For example, a higher level of memory cell densities may be achieved compared to other MRAM devices that include additional elements. Increased densities may result in decreased costs for a given amount of storage capacity. In addition the memory cell strings described herein may provide better electrical circuit isolation compared to previous MRAM devices. The improved isolation may allow for more reliable detection of the state of memory cells in a memory cell string.

The MRAM device may also be used for long-term data storage in a computer. Such a device offers many advantages (e.g. faster speed, smaller size) over hard drives and other conventional long-term data storage devices. Additionally, the MRAM device could possibly replace DRAM and other fast, short-term memory in computers.

The memory device is not limited to the specific embodiments described and illustrated above. For instance, an MRAM device is not limited to the use of spin dependent tunneling devices. Other types of devices that could be used include, but are not limited to, giant magnetoresistance ("GMR") devices.

Although the above-described embodiments are disclosed in conjunction with the operation of an MRAM device, it should be understood that the above-disclosed to configurations could be implemented in conjunction with a variety of different thin film devices while remaining within the spirit and scope of the present invention. Consider an example of a chemical sensor. So called "Laboratory on a Chip" thin film devices utilize chemical reactions to analyze specimens. The rate of the chemical reactions are exponentially dependent on temperature. Accordingly, by heating the specimen, the rate of the chemical reaction is increased, and the time in which the results are obtained is decreased.

A thin film device and a method of providing thermal assistance therein is disclosed. Accordingly, a heater material is utilized to thermally assist in the operation of the thin film device. By utilizing a heater material to thermally assist in the operation of the thin film device, a substantial improvement in the accuracy and performance of the thin film device is achieved.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed:

1. A thin film device comprising:
   at least one patterned thin film layer;
   a heater material coupled to at least one of the patterned thin film layers for providing thermal assistance thereto wherein the heater material comprises at least one of amorphous silicon and amorphous carbon; and
   a conductor coupled to the heater material to supply energy to the heater material.

2. The device of claim 1 wherein the thin film device comprises a magnetic random access memory device.

3. The device of claim 1 wherein the at least one patterned thin film layer is formed on the heater material.

4. The device of claim 1 wherein the conductor is a split conductor and the heater material is connected between the split conductor.

5. The device of claim 1 wherein the energy comprise radio frequency energy.

6. The device of claim 2 wherein the at least one patterned thin film layer comprises a magnetic memory element.

7. The device of claim 3 wherein the heater material comprises a metal.

8. The device of claim 4 wherein the conductor comprises a conductive sidewall material comprising at least one of Cu, Au, Ag, Pt, Al.

9. The device of claim 6 wherein the magnetic memory element comprises at least one of a spin dependent tunnel junction and a giant magnetoresistive device.

10. The device of claim 6 wherein the magnetic memory element includes a free layer and the heater material provides thermal assistance in switching a magnetic orientation of the free layer.

11. The device of claim 5 wherein the at least one patterned thin film layer is formed over a dielectric material and the dielectric material is in contact with the heater material.

12. The device of claim 8 wherein the conductive side wall material is coupled to a power source.

13. The device of claim 12 wherein the conductive side wall material is coupled to the power source via a decoder.

14. A computer system comprising:
    a processor;
    an interface module coupled to the processor; and
    a magnetic random access memory device coupled to the interface module wherein the magnetic random access memory device includes a plurality of magnetic memory elements, a heater material coupled to at least one of the plurality of magnetic memory elements for providing thermal assistance in switching a magnetic orientation of the at least one of the plurality of magnetic memory elements and a conductor coupled to the heater material for supplying energy to the heater material wherein the conductor is a split conductor and the heater material is connected between the split conductor.

15. The computer system of claim 14 wherein each of the plurality of magnetic memory elements comprises a spin dependent tunneling junction.

16. The computer system of claim 14 wherein each of the plurality of magnetic memory elements is formed on the heater material.

17. The computer system of claim 16 wherein the heater material comprises amorphous carbon.

18. The computer system of claim 16 wherein the heater material comprises amorphous silicon.

19. The computer system of claim 16 wherein the heater material is coupled to a conductive sidewall material wherein the conductive sidewall material comprises at least one of Cu, Au, Ag, Pt, Al.

20. The computer system of claim 19 wherein the heater material is formed in between the conductive sidewall material.

21. A magnetic random access memory device comprising:
    a plurality of magnetic memory elements;
    a heater material coupled to at least one of the plurality of magnetic memory elements wherein the heater material comprises at least one of amorphous carbon and amorphous silicon;
    a decoder coupled to the heater material; and
    a radio frequency power source coupled to the decoder for providing heat to the heater material to thermally assist in switching a magnetic orientation of the at least one of the plurality of magnetic memory elements.

22. A thin film device comprising:
    at least one patterned thin film layer;
    a heater material coupled to at least one of the patterned thin film layers for providing thermal assistance thereto; and
    a conductor coupled to the heater material to supply energy to the heater material wherein the conductor is a split conductor and the heater material is connected between the split conductor.

* * * * *